United States Patent
Motozawa

(10) Patent No.: US 11,606,097 B2
(45) Date of Patent: Mar. 14, 2023

(54) PLL CIRCUIT USING INTERMITTENT OPERATION AMPLIFIER

(71) Applicant: RENESAS ELECTRONICS CORPORATION, Tokyo (JP)

(72) Inventor: Atsushi Motozawa, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 17/501,389

(22) Filed: Oct. 14, 2021

(65) Prior Publication Data

US 2022/0131547 A1    Apr. 28, 2022

(30) Foreign Application Priority Data

Oct. 22, 2020  (JP) .............................. JP2020-177102

(51) Int. Cl.
| | |
|---|---|
| H03L 7/099 | (2006.01) |
| H03K 5/26 | (2006.01) |
| H03L 7/093 | (2006.01) |
| H03L 7/10 | (2006.01) |
| H03L 7/107 | (2006.01) |

(52) U.S. Cl.
CPC .............. *H03L 7/099* (2013.01); *H03K 5/26* (2013.01); *H03L 7/093* (2013.01); *H03L 7/102* (2013.01); *H03L 7/1075* (2013.01); *H03L 2207/06* (2013.01)

(58) Field of Classification Search
CPC ......... H03L 7/099; H03L 7/093; H03L 7/102; H03L 7/1075; H03K 5/26
USPC .................. 327/156; 331/10, 1 A, 16, 34, 12
See application file for complete search history.

(56) References Cited

U.S. PATENT DOCUMENTS

| | | |
|---|---|---|
| 7,692,500 B1 | 4/2010 | Koukab et al. |
| 8,040,191 B2 | 10/2011 | Hirai |
| 2010/0271141 A1 | 10/2010 | Hirai |

(Continued)

FOREIGN PATENT DOCUMENTS

JP    2010-273320 A    12/2010

OTHER PUBLICATIONS

Extended European Search Report issued in corresponding European Patent Application No. 21203934.1-1203, dated Mar. 25, 2022.

*Primary Examiner* — Arnold M Kinkead
(74) *Attorney, Agent, or Firm* — McDermott Will & Emery LLP

(57) ABSTRACT

A PLL circuit includes a phase comparator, an integrator path, a proportional path, a current controlled oscillator, a divider, and a double integrator path. The double integrator path includes an intermittent operation gm amplifier, a filter circuit, and a voltage-current conversion circuit. The intermittent operation gm amplifier receives an output voltage of a filter circuit. When a pulse CLK for an intermittent operation is ON, the intermittent operation gm amplifier outputs its voltage to the filter circuit. When the pulse CLK for the intermittent operation is OFF, the intermittent operation gm amplifier does not output the output voltage of the filter circuit to the filter circuit. Even when the pulse CLK for the intermittent operation is OFF, an input potential of the voltage-current conversion circuit is held by the filter circuit, and a current to the current controlled oscillator flows. This makes it possible to oscillate at a high frequency without increasing an area of the filter circuit.

4 Claims, 9 Drawing Sheets

(56) References Cited

U.S. PATENT DOCUMENTS

2019/0268006 A1  8/2019  Hiraku
2022/0038105 A1* 2/2022  Mukherjee .............. H03L 7/099

* cited by examiner

PLL CIRCUIT USING INTERMITTENT OPERATION AMPLIFIER

CROSS-REFERENCE TO RELATED APPLICATIONS

The disclosure of Japanese Patent Application No. 2020-177102 filed on Oct. 22, 2020 including the specification, drawings and abstract is incorporated herein by reference in its entirety.

BACKGROUND

The present invention relates to a PLL circuit using an intermittent operation amplifier.

In recent years, a PLL (Phase Locked Loop) circuit is often used as an oscillation circuit mounted on a semiconductor device. The PLL circuit is a circuit configured to control an oscillation frequency of an output signal so that a phase of a reference signal is synchronized with a phase of the output signal.

Recently, at the same time as a demand for process shrink, a demand for high frequency oscillation for a ring type PLL circuit is increasing. About ten ring type PLL circuits are mounted on a System-on-chip (SoC) product. Since a PLL circuit is usually configured by an analog circuit, the PLL circuit hardly benefits from the process shrink.

Here, a PLL circuit provided with a voltage control oscillator (VCO) that has a low gain input and a high gain input is known (for example, see Patent Document 1). In a PLL circuit disclosed in Patent Document 1, a voltage control oscillator has two voltage signals as low gain inputs and one voltage signal as a high gain input, and generates an oscillation frequency on the basis of these three voltage signals.

There are disclosed techniques listed below.
[Patent Document 1] Japanese Unexamined Patent Application Publication No. 2010-273320

SUMMARY

The PLL circuit achieve both a high-speed phase lock and stability of a circuit by automatically changing loop characteristics appropriately depending upon the situation. Further, before the phase lock, it is required to cause an output frequency to reach a desired frequency at a high speed. For this reason, it is necessary to arrange a zero point of an open-loop characteristic of the PLL circuit at a high frequency. On the other hand, after the phase lock, it is required to secure high stability. For this reason, it is necessary to arrange the zero point of the open-loop characteristic of the PLL circuit at a low frequency. Therefore, in order to achieve both the high-speed phase lock and the circuit stability, it is necessary to dynamically move the zero point before and after the phase lock.

The zero point described above becomes a function of mutual conductance gm and capacitance C of a filter circuit ($\propto$ gm/C). It is a value of the zero point is small from the viewpoint of securing stability. In the PLL circuit described in Patent Document 1, it is desirable to reduce a gm value of a voltage-current conversion circuit, but in order to keep a circuit operation normal, the minimum value that can be reduced is limited. As a result, the capacitance of the filter circuit also becomes large to an extent, and there is a limit to reducing an area of the filter circuit.

The other object and new feature will become apparent from description of the present specification and the accompanying drawings.

The present invention has been made in view of the above problems, and it is one of objects of the present invention to provide a PLL circuit capable of making, by providing a double integrator path at a low speed, which executes an intermittent operation, a value of mutual conductance gm very small by the intermittent operation, and thus, oscillating at a high frequency without increasing the area of the filter circuit.

According to one embodiment, a PLL circuit using an intermittent operation amplifier includes: a phase comparator configured to detect a phase difference between a reference clock and a feedback clock to output a first voltage signal based on the phase difference; an integrator path including a first filter circuit and a first voltage-current conversion circuit, the first voltage signal from the phase comparator being inputted to the integrator path, the integrator path being configured to output a first current signal; a proportional path including a second filter circuit, the first voltage signal from the phase comparator being inputted to the proportional path, the proportional path being configured to output a second current signal; a double integrator path including a gm amplifier, a third filter circuit, and a second voltage-current conversion circuit, a second voltage signal from the first filter circuit of the integrator path being inputted to the double integrator path, the double integrator path being configured to output a third current signal; a current controlled oscillator into which the first current signal, the second current signal, and the third current signal are respectively inputted from the integrator path, the proportional path, and the double integrator path, the current controlled oscillator being configured to output an oscillation signal with a frequency clock based on a total current amount; and a divider configured to divide the oscillation signal to output a signal obtained by dividing the oscillation signal as the feedback clock to the phase comparator. In this case, a pulse signal for causing the gm amplifier to execute an intermittent operation is inputted into the gm amplifier.

According to one embodiment, it is possible to provide a PLL circuit capable of making, by providing a double integrator path at a low speed, which executes an intermittent operation, a value of mutual conductance gm very small by the intermittent operation, and thus, oscillating at a high frequency without increasing the area of the filter circuit.

DETAILED DESCRIPTION

Figure 1:
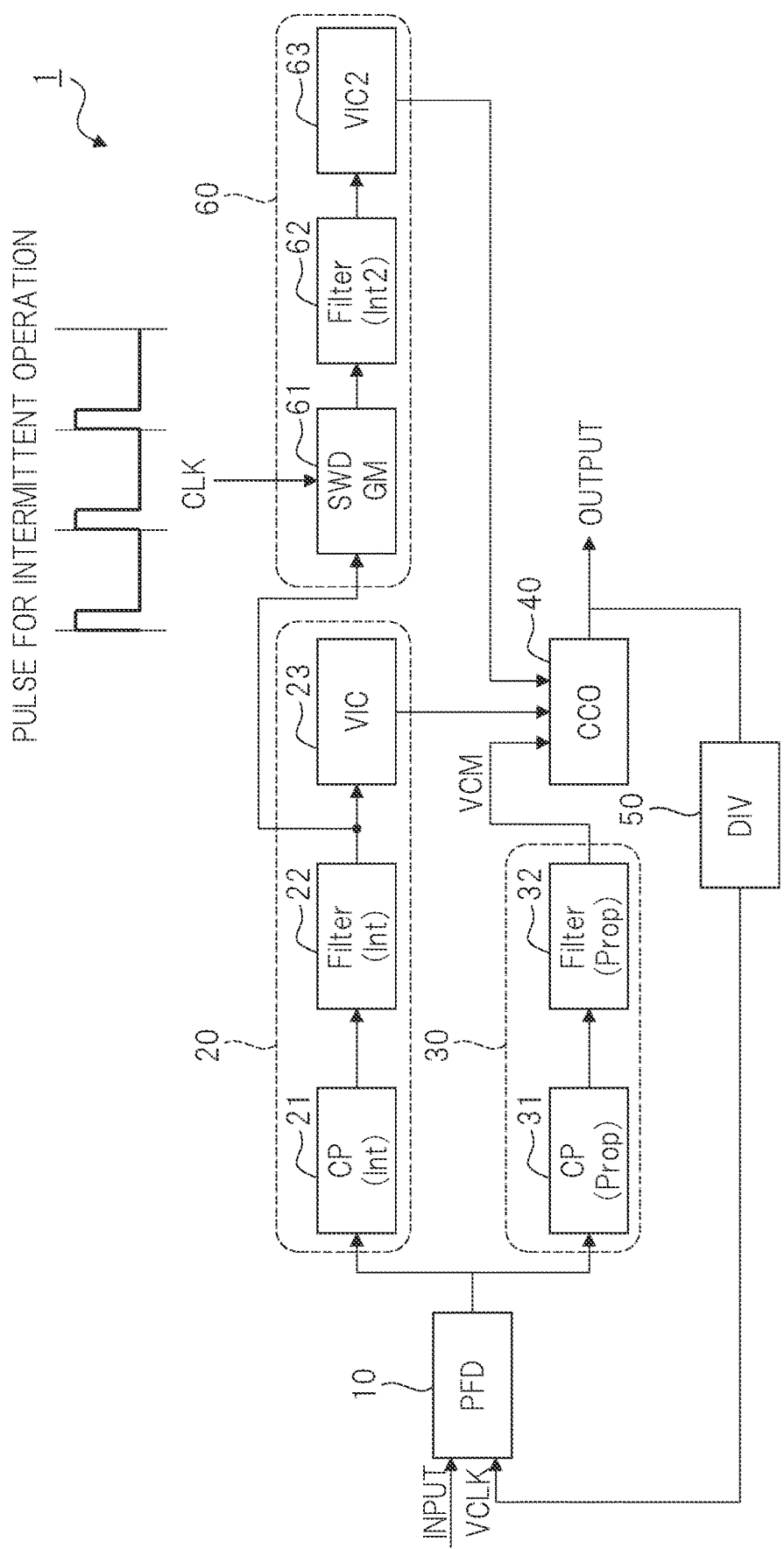
FIG. 1 is a block diagram illustrating one example of a PLL circuit using an intermittent operation amplifier according to a first embodiment.

In embodiments described below, the invention will be described in a plurality of sections or embodiments when required as a matter of convenience. However, these sections or embodiments are not irrelevant to each other unless otherwise stated, and the one relates to the entire or a part of the other as a modification example, details, or a supplementary explanation thereof. Further, in the embodiments described below, in a case of referring to the number of elements (including number of pieces, values, amount, range, and the like), the number of the elements is not limited to a specific number unless otherwise stated or except the case where the number is apparently limited to a specific number in principle, and the number larger or smaller than the specified number may also be applicable. Moreover, in the embodiments described below, it goes without saying that the components (including element steps and the like) are not always indispensable unless otherwise stated or except the case where the components are apparently indispensable in principle. Similarly, in the embodiments described below, when the shape of the components, positional relation thereof, and the like are mentioned, the substantially approximate and similar shapes and the like are included therein unless otherwise stated or except the case where it is conceivable that they are apparently excluded in principle. The same goes for the numerical value and the range described above.

Hereinafter, the embodiments will be described in detail with reference to the drawings. Note that in all of the drawings for explaining the embodiments, the same reference numeral is assigned to members having the same function, and repeated explanation thereof will be omitted. Further, in the following embodiments, in principle, explanation of the same or similar will not be repeated unless otherwise necessary.

(Problems and the Like)

First, a background and problems of the present invention will be described.

Conventionally, a PLL circuit that has two parallel paths in the latter part of a phase comparator is known. One path is an integrator path, which controls an output frequency of the PLL circuit. The other path is a proportional path, which controls a phase of an output clock of the PLL circuit.

Here, as described above, in order to secure stability of the PLL circuit after a phase lock, it is desired to set a zero point of an open-loop characteristic in the PLL circuit to a low frequency. On the other hand, there is also an increasing demand to oscillate a current controlled oscillator at a high frequency. However, an oscillation frequency of the current controlled oscillator is proportional to a current that flows in the current controlled oscillator. Further, since a range of an output voltage of a charge pump is restricted, it is necessary to keep an input voltage of a voltage-current conversion circuit constant. Under such a situation, in order to cause the PLL circuit to operate at a high oscillation frequency, it is need to add a voltage-current conversion circuit to increase an output current. Such a circuit configuration causes mutual conductance gm to increase.

If no measures are taken for stability of the circuit, the zero point is to be located in a high frequency direction, and this deteriorates the stability of the circuit. On the other hand, in order to take stability measures, it is necessary to increase the capacitance C of a filter circuit. However, there is a problem that if this capacitance C is increased, an area of the filter circuit becomes large, and this causes cost of the entire chip including the PLL circuit to increase. For example, in a conventional PLL circuit, when an oscillation frequency is increased by about 1.5 to 2 times, an area of a filter circuit increases by about 2.5 to 5 times.

As described above, there is a trade-off relationship between a high speed phase lock (or a high speed response) and the stability of the circuit. In the conventional PLL circuit that has the two parallel paths in the latter part of the phase comparator, the zero point cannot be changed dynamically and automatically, and it was difficult to achieve both of these.

In order to solve such problems, a method of connecting integrator paths in series to be duplicated can be considered. A conventional double integrator path is composed of a continuous amplifier and a capacitor. It is desirable that an operation of the double integrator path be slow, but in order to cause the operation of the double integrator path to be slow, a time constant must be increased. For this reason, there is also a problem that the mutual conductance gm of the continuous amplifier must be reduced, and as a result, an area of the capacitance becomes large.

First Embodiment

In order to solve the problems described above, in a PLL circuit using an intermittent operation amplifier according to a first embodiment, by providing a double integrator path in series after an integrator path, and inputting a pulse for an intermittent operation to the intermittent operation amplifier in this double integrator path, the double integrator path is caused to operate at a low speed. This makes it possible to oscillate the PLL circuit at a high frequency without affecting stability of the circuit. Hereinafter, the PLL circuit using the intermittent operation amplifier according to the present embodiment will be described in detail.

(Configuration of PLL Circuit Using Intermittent Operation Amplifier)

First, one example of a configuration of a PLL circuit 1 using an intermittent operation amplifier according to the first embodiment (hereinafter, may be abbreviated as the "PLL circuit 1") will be described. FIG. 1 is a block diagram illustrating one example of the PLL circuit 1 using the intermittent operation amplifier according to the first embodiment. As illustrated in FIG. 1, the PLL circuit 1 according to the present embodiment includes a phase comparator 10, an integrator path (integrator circuit train) 20, a proportional path (proportional circuit train) 30, a current controlled oscillator 40, a divider 50, and a double integrator path (double integrator circuit train) 60.

The phase comparator 10 is a circuit that generates a voltage signal indicating a phase difference between two signal inputs. Specifically, for example, the phase comparator 10 compares a phase of a reference signal (an input clock or a reference clock) inputted from a reference oscillator (not illustrated in the drawings) with a phase of an output signal (an output clock or a feedback clock) of the divider 50, that is, detects a phase difference of these, and outputs a voltage signal based on the phase difference (that is, a first voltage signal) to an integrator path 20 and a proportional path 30. Note that this voltage signal is a signal whose pulse width changes in accordance with the phase difference.

The integrator path 20 includes a charge pump 21, a filter circuit 22, and a voltage-current conversion circuit 23. The charge pump 21 is a circuit that is configured by combining a capacitor and a switch (not illustrated in the drawings) and outputs, to the filter circuit 22, a current with an amount based on the phase difference of the output signal (voltage) of the phase comparator 10, which is an input signal.

The filter circuit 22 is a circuit that receives an output current from the charge pump 21, and converts the current to a voltage to output the converted voltage to the voltage-current conversion circuit 23 and the double integrator path 60. The voltage-current conversion circuit 23 is a circuit that receives the output voltage from the filter circuit 22, and outputs a current based on the output voltage to the current controlled oscillator 40.

The proportional path 30 includes a charge pump 31 and a filter circuit 32. The charge pump 31 is a circuit that outputs a current with an amount based on the phase difference of the output signal (voltage) of the phase comparator 10, which is an input signal, to the filter circuit 32. Unlike the filter circuit 22, the filter circuit 32 is a circuit that smooths the output current from the charge pump 31 to output the smoothed current to the current controlled oscillator 40.

The double integrator path 60 includes an intermittent operation gm amplifier (transconductance amplifier) 61, a filter circuit 62, and a voltage-current conversion circuit 63. The double integrator path 60 according to the present embodiment directly inputs a pulse CLK for an intermittent operation (a pulse signal) to the intermittent operation gm amplifier 61, whereby the intermittent operation gm amplifier 61 is caused to operate an intermittent operation and the double integrator path 60 operates at a low speed as a whole.

A low speed operation means that a zero point of an open-loop characteristic of the PLL circuit is located at a low frequency. The zero point at the low frequency does not affect stability of the entire circuit. With reference to the stability, attention may be paid to a position of a zero point at a high frequency, which is formed by a configuration of the integrator path 20 in the previous stage.

The intermittent operation gm amplifier 61 is a circuit that receives the output voltage from the filter circuit 22, and outputs the voltage to the filter circuit 62 when the pulse CLK for the intermittent operation is ON. On the other hand, the intermittent operation gm amplifier 61 does not output the output voltage of the filter circuit 22 to the filter circuit 62 when the pulse CLK for the intermittent operation is OFF.

The filter circuit 62 is a circuit that smooths the output voltage from the intermittent operation gm amplifier 61 to output the smoothed voltage to the voltage-current conversion circuit 63. The filter circuit 62 outputs the output voltage of the intermittent operation gm amplifier 61 to the voltage-current conversion circuit 63 when the pulse CLK for the intermittent operation to the intermittent operation gm amplifier 61 is ON. On the other hand, the filter circuit 62 holds an input potential of the voltage-current conversion circuit 63 even when the pulse CLK for the intermittent operation to the intermittent operation gm amplifier 61 is OFF.

The voltage-current conversion circuit 63 is a circuit that receives the output voltage from the filter circuit 62 to output a current based on the output voltage to the current controlled oscillator 40. As described above, even though the pulse CLK for the intermittent operation is OFF, the input potential of the voltage-current conversion circuit 63 is held. Thus, a current flows into the current controlled oscillator 40 during that time.

The current controlled oscillator 40 is a circuit that receives the output current of the voltage-current conversion circuit 23, the output current of the filter circuit 32, and the output current of the voltage-current conversion circuit 63 to not only output an output voltage (an oscillation signal) with a high frequency clock based on the total amount of current to the outside of the PLL circuit 1, but also output the output voltage to the divider 50.

The divider 50 is a circuit that divides the oscillation signal from the current controlled oscillator 40 to output the oscillation signal after division to the phase comparator 10.

Figure 2:
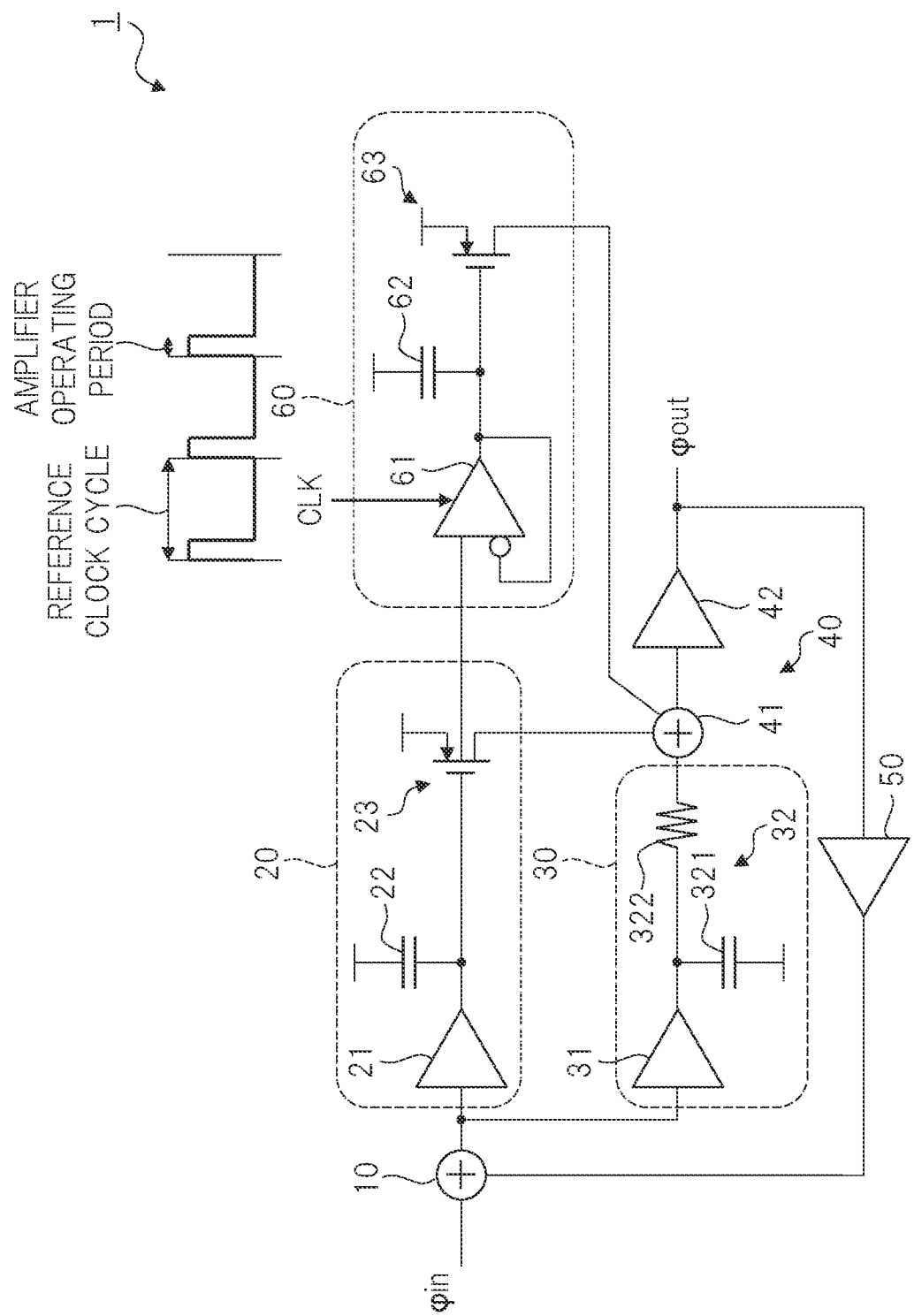
FIG. 2 is a view illustrating one example of a circuit configuration of the PLL circuit using the intermittent operation amplifier illustrated in FIG. 1.

Next, a circuit configuration for realizing the PLL circuit 1 illustrated in FIG. 1 will be described with reference to FIG. 2. FIG. 2 is a view illustrating one example of a circuit configuration of the PLL circuit 1 using the intermittent operation amplifier illustrated in FIG. 1. As illustrated in FIG. 2, in the integrator path 20, for example, the charge pump 21 is configured by an operational amplifier, the filter circuit 22 is configured by a capacitor, and the voltage-current conversion circuit 23 is configured by a P-channel type insulated gate transistor.

Further, in the proportional path 30, for example, the charge pump 31 is composed of an operational amplifier, and the filter circuit 32 is a primary low-pass filter composed of a capacitor 321 and a resistance 322.

For example, the current controlled oscillator 40 is configured by the integrator path 20, the proportional path 30, an adder 41 configured to add an input signal from the double integrator path 60, and an operational amplifier 42. The divider 50 is configured by an operational amplifier, for example.

In the double integrator path 60, as well as the integrator path 20, for example, the filter circuit 62 is configured by a capacitor, and the voltage-current conversion circuit 63 is configured by a P-channel type insulated gate transistor.

Note that the intermittent operation gm amplifier 61 can control equivalent mutual conductance gm by an operation rate thereof, that is, a ratio an amplifier operating period with respect to a reference clock cycle. For that reason, in the PLL circuit 1 according to the present embodiment, the double integrator path 60 can adjust the time constant of the double integrator path 60 without adding a separate circuit after the intermittent operation gm amplifier 61, whereby it is also easy to increase the time constant if necessary.

(Operation of PLL Circuit)

Next, an operation of the PLL circuit 1 using the intermittent operation amplifier according to the first embodiment will be described. In order to output a high frequency clock, a large amount of input current is required for the current controlled oscillator 40. In the present embodiment, in addition to a current outputted from the integrator path 20 and a current outputted from the proportional path 30, a current outputted from the double integrator path 60 is also inputted into the current controlled oscillator 40. As described above, the current controlled oscillator 40 can output the output voltage of the high frequency clock (the oscillation signal) to the outside in accordance with the large amount of input current.

On the other hand, the intermittent operation gm amplifier 61 is provided in the double integrator path 60, and the intermittent operation gm amplifier 61 is caused to execute the intermittent operation by directly inputting the pulse CLK for the intermittent operation to the intermittent operation gm amplifier 61. The pulse CLK for the intermittent operation causes the intermittent operation gm amplifier 61 to execute the intermittent operation in accordance with a pulse width. However, even when the pulse CLK for the intermittent operation is OFF, the filter circuit 62 holds the input voltage of the voltage-current conversion circuit 63. As a result, the output current of the voltage-current conversion circuit 63 always flows into the current controlled oscillator 40.

Therefore, since the PLL circuit 1 according to the present embodiment increases the current inputted into the current controlled oscillator 40, the current controlled oscillator 40 can output the high frequency clock.

(Features and Effects of First Embodiment)

Next, main features and main effects of the PLL circuit 1 using the intermittent operation amplifier according to the first embodiment will be described.

The main features of the PLL circuit 1 using the intermittent operation amplifier according to the first embodiment illustrated in FIG. 1 and FIG. 2 are that the double integrator path 60 is provided after the integrator path 20, and by inputting the pulse CLK for the intermittent operation into the intermittent operation gm amplifier 61 provided in the double integrator path 60 and causing the intermittent operation gm amplifier 61 to execute the intermittent operation, the double integrator path 60 is caused to operate at the low speed. Further, a further feature of the PLL circuit 1 using the intermittent operation amplifier is that the high frequency clock is generated without affecting a feedback loop by causing the double integrator path 60 to operate at the low speed.

Figure 3:
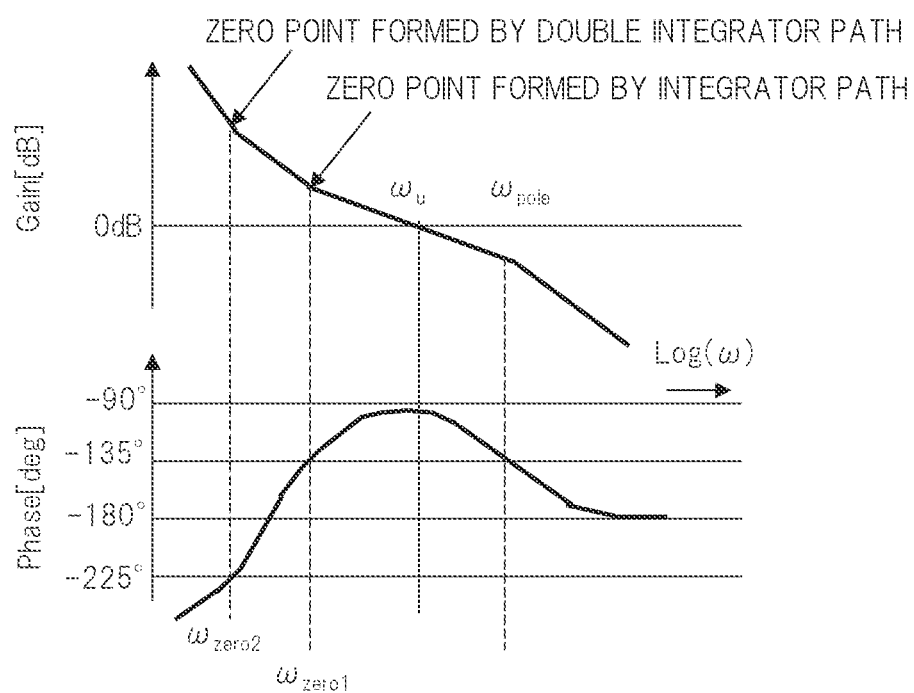
FIG. 3 is an explanatory drawing for explaining an open-loop characteristic of the PLL circuit using the intermittent operation amplifier according to the first embodiment.

FIG. 3 is an explanatory drawing for explaining an open-loop characteristic of the PLL circuit using the intermittent operation amplifier according to the first embodiment. As illustrated in FIG. 3, a zero point formed by the double integrator path 60 is located at a lower frequency side than a zero point formed by the integrator path 20. Here, the zero point at the low frequency does not affect the stability of the circuit. Therefore, for the stability of the circuit, attention is to be paid to the position of the zero point formed by the integrator path 20.

Since the PLL circuit 1 using the intermittent operation amplifier has the configuration as described above in this manner, it is possible to make the mutual conductance gm value of the double integrator path 60 very small by means of the intermittent operation. This makes it possible to cause the PLL circuit 1 to oscillate at the high frequency without increasing the area of the filter circuit 62. In this case, it is possible to stably control the current controlled oscillator 40 of the PLL circuit 1 configured to output the high frequency clock without changing the point of the zero point that affects the stability of the circuit.

Further, it is possible to control the mutual conductance gm by the operation rate of the intermittent operation gm amplifier 61. Therefore, in the double integrator path 60, the time constant can be adjusted without adding a separate circuit after the intermittent operation gm amplifier 61, and it is easy to make the time constant larger.

Second Embodiment

Next, a second embodiment will be described. Note that the same reference numeral is assigned to each unit that has the similar function to that according to the first embodiment, and in principle, explanation thereof will be omitted. In the first embodiment, the charge pumps 21, 31 are respectively provided in the integrator path 20 and the proportional path 30. In the present embodiment, a PLL circuit using an intermittent operation amplifier from which these charge pumps 21, 31 are removed will be described.

(Configuration of PLL Circuit Using Intermittent Operation Amplifier)

Figure 4:
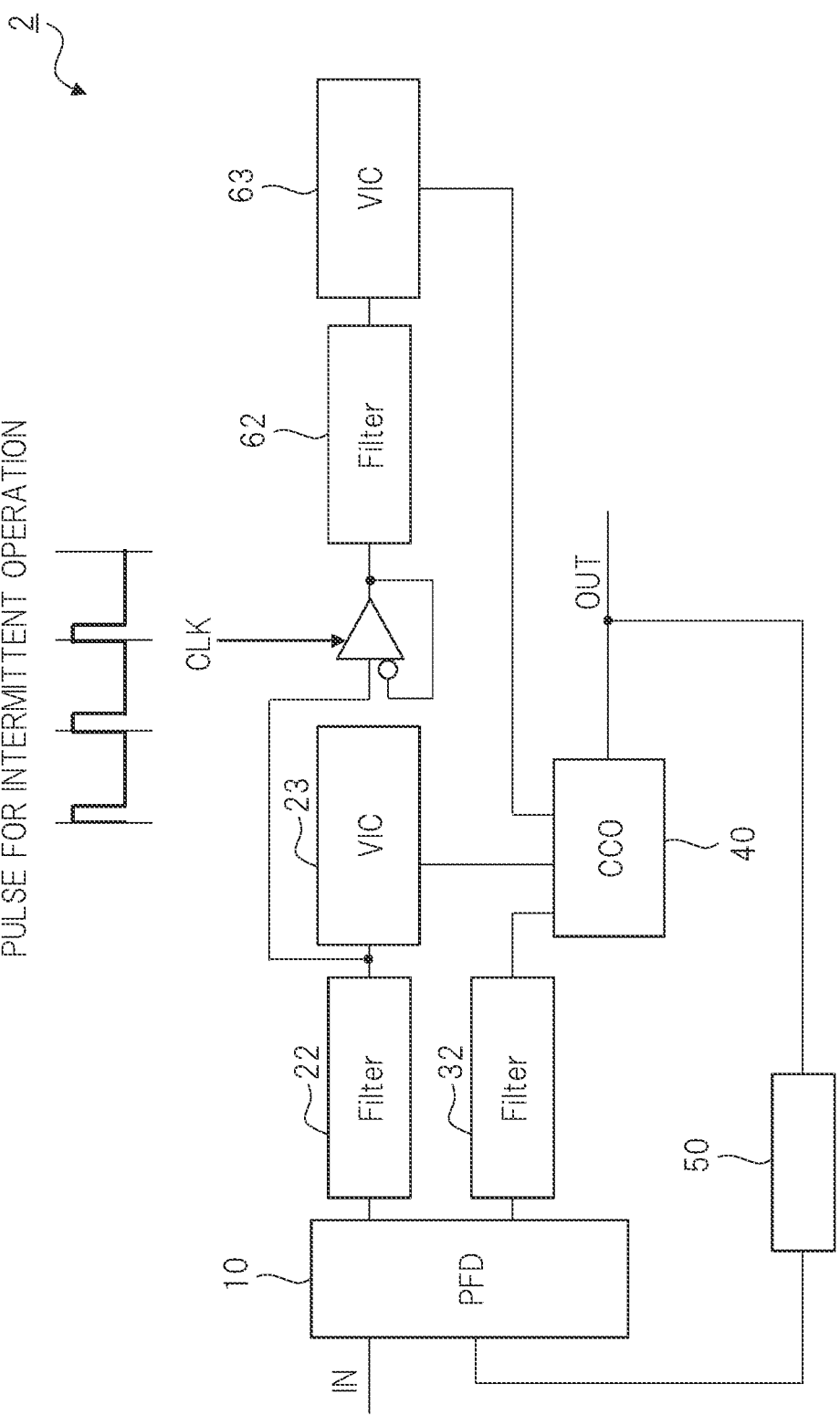
FIG. 4 is a block diagram illustrating one example of a PLL circuit using an intermittent operation amplifier according to a second embodiment.

First, one example of a configuration of a PLL circuit 2 using an intermittent operation amplifier according to the second embodiment (hereinafter, may be abbreviated as the "PLL circuit 2") will be described. FIG. 4 is a block diagram illustrating one example of the PLL circuit using the intermittent operation amplifier according to the second embodiment.

As illustrated in FIG. 4, the PLL circuit 2 according to the present embodiment includes: a phase comparator 10; a filter circuit 22 and a voltage-current conversion circuit 23 as an integrator path; a filter circuit 32 as a proportional path; a current controlled oscillator 40; a divider 50; and an intermittent operation gm amplifier 61, a filter circuit 62, and a voltage-current conversion circuit 63 as a double integrator path.

In the present embodiment, the intermittent operation gm amplifier 61 has a function as a buffer circuit provided between an output of the filter circuit 22 and an input of the filter circuit 62. As well as the first embodiment, by adjusting an operation rate of the intermittent operation gm amplifier 61 using a pulse CLK for an intermittent operation, an equivalent signal processing speed as the double integrator path is reduced.

Figure 5:
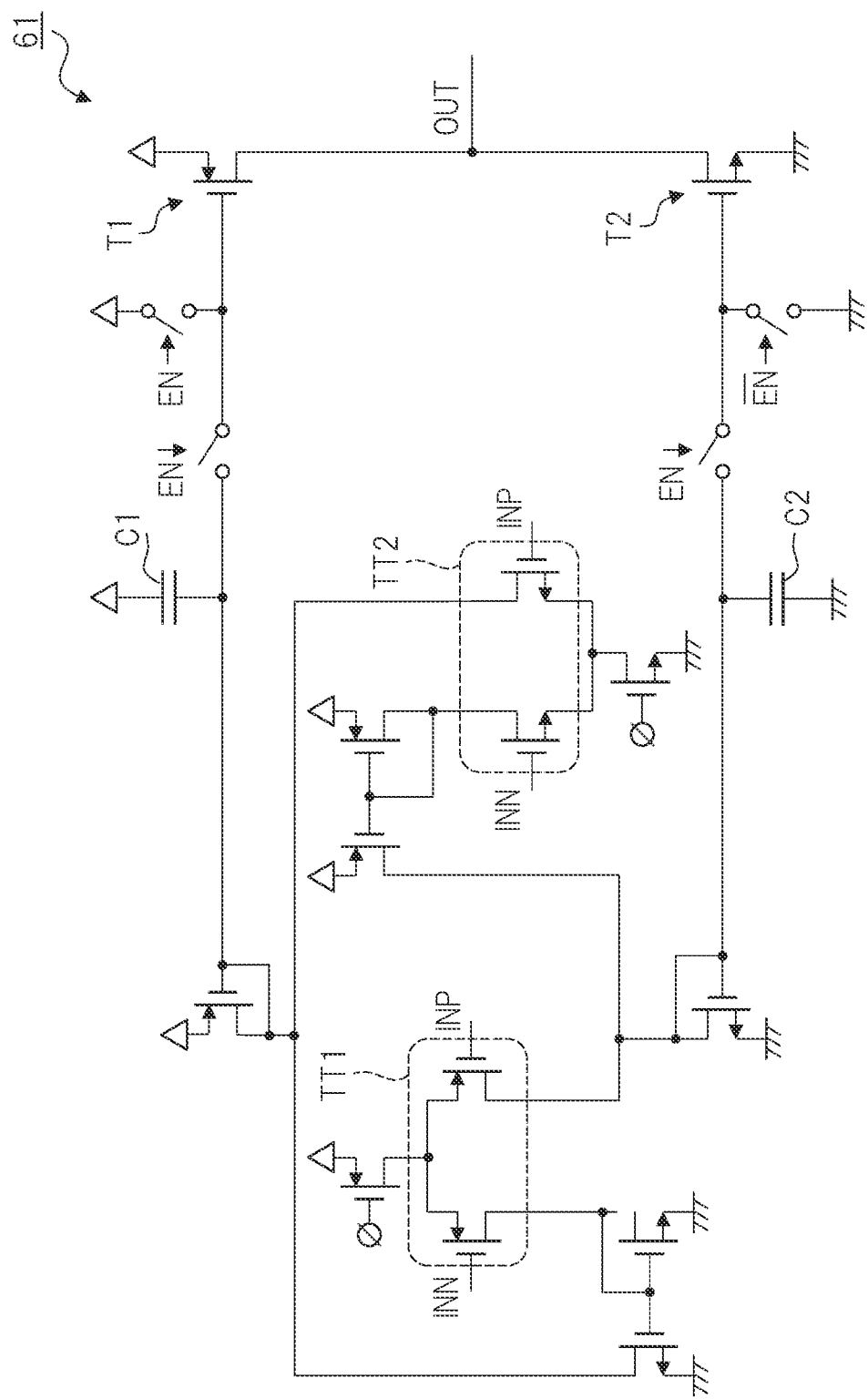
FIG. 5 is a configuration diagram illustrating one example of a circuit configuration of an intermittent operation gm amplifier illustrated in FIG. 4.

Here, an implementation example of the intermittent operation gm amplifier 61 will be described with reference to FIG. 5. FIG. 5 is a configuration diagram illustrating one example of a circuit configuration of the intermittent operation gm amplifier illustrated in FIG. 4. As illustrated in FIG. 5, the intermittent operation gm amplifier 61 includes capacitors C1, C2 for potential stabilization, a PMOS differential pair TT1, a NMOS differential pair TT2, a push MOS transistor T1, a pull MOS transistor T2, and the like.

Since the output signal of the phase comparator 10 is inputted into the filter circuit 22 in the previous stage, an output potential of the filter circuit 22 depends upon an oscillation frequency, and may become a wide range of potentials. For that reason, the intermittent operation gm amplifier 61 has a configuration corresponding to a rail-to-rail input (that is, an input configuration using the PMOS differential pair TT1 and the NMOS differential pair TT2). Further, by respectively providing switches EN in front of gates of the push MOS transistor T1 and the pull MOS transistor T2 provided in parallel in an output unit and turning ON/OFF the switches EN, the intermittent operation of the intermittent operation gm amplifier 61 is realized. When the switch EN is high, the intermittent operation gm amplifier 61 operates. On the other hand, when the switch EN is low, the intermittent operation gm amplifier 61 stops.

Further, the output unit of the intermittent operation gm amplifier 61 has a push-pull configuration with the push MOS transistor T1 and the pull MOS transistor T2. When the intermittent operation gm amplifier 61 stops, an output of the intermittent operation gm amplifier 61 becomes a high impedance. For that reason, the input potential to the voltage-current conversion circuit 63 is fixed. As a result, the voltage-current conversion circuit 63 can continue to supply a current to the current controlled oscillator 40 regardless of the intermittent operation of the intermittent operation gm amplifier 61 (that is, regardless of whether the pulse CLK for the intermittent operation is ON or OFF).

(Features and Effects of Second Embodiment)

Next, main features and main effects of the PLL circuit 2 using the intermittent operation amplifier according to the second embodiment will be described.

The main features of the PLL circuit 2 using the intermittent operation amplifier according to the present embodiment are that charge pumps of the integrator path and the proportional path are omitted from the PLL circuit 1 according to the first embodiment. As a result, the intermittent operation gm amplifier 61 constitutes the buffer circuit, and continues to flow the current from the voltage-current conversion circuit 63 to the current controlled oscillator 40 when the PLL circuit 2 is stable.

Since the PLL circuit 2 using the intermittent operation amplifier has the configuration as described above, the intermittent operation gm amplifier 61 is caused to operate in a discrete manner in time (that is, intermittently). However, an input voltage to the voltage-current conversion circuit 63 becomes a continuous value. As a result, unlike a PLL circuit composed of an analog circuit and a digital circuit, a problem about resolution does not occur.

Further, by such a configuration, it is possible to adjust a mutual conductance gm value more simply in accordance with a pulse width of the pulse CLK for the intermittent operation or an appearance frequency thereof.

Third Embodiment

Next, a third embodiment will be described. Note that hereinafter, the same reference numerals are respectively assigned to components having the similar functions to those in the first embodiment or the second embodiment, and explanation thereof will be omitted in principle. In the first embodiment, the pulse CLK for the intermittent operation for causing the intermittent operation gm amplifier 61 to execute the intermittent operation is fixed. In the present embodiment, a PLL circuit using an intermittent operation amplifier, which further includes a pulse generator in order to change a pulse width of a pulse CLK for an intermittent operation for an intermittent operation gm amplifier 61 before and after a clock phase is locked, will be described.

(Configuration of PLL Circuit Using Intermittent Operation Amplifier)

Figure 6:
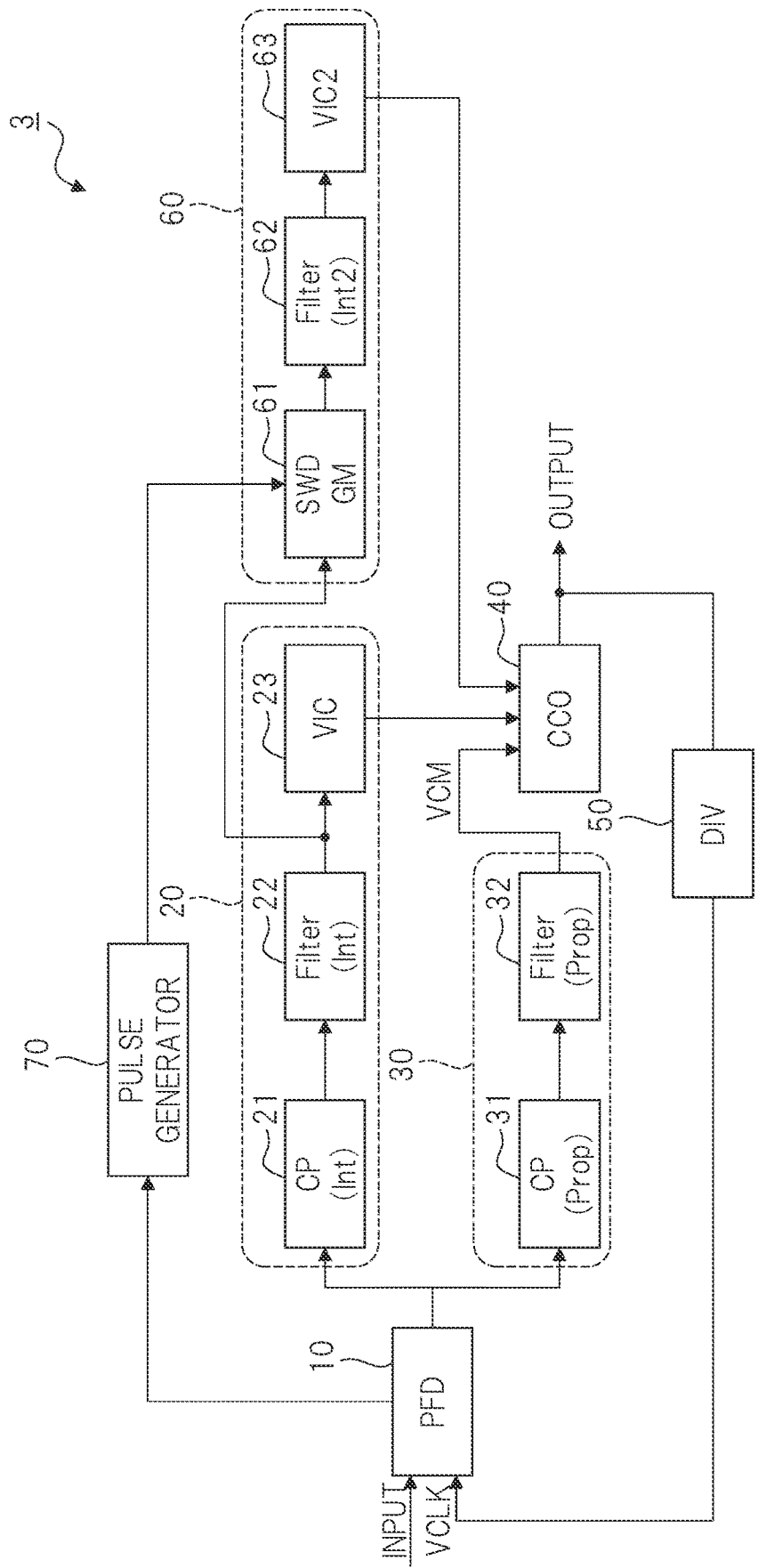
FIG. 6 is a block diagram illustrating one example of a PLL circuit using an intermittent operation amplifier according to a third embodiment.

First, one example of a configuration of a PLL circuit 3 using an intermittent operation amplifier according to the third embodiment (hereinafter, may be abbreviated as the "PLL circuit 3") will be described. FIG. 6 is a block diagram illustrating one example of the PLL circuit 3 using the intermittent operation amplifier according to the third embodiment. As illustrated in FIG. 6, the PLL circuit 3 according to the present embodiment further includes a pulse generator 70 in addition to the configuration of the PLL circuit 1 according to the first embodiment. Note that a configuration and an operation of the PLL circuit 3 other than those regarding the pulse CLK for the intermittent operation are similar to the configuration and the operation of the PLL circuit 1 according to the first embodiment, and detailed explanation thereof will thus be omitted herein.

A target of the PLL circuit 3 according to the present embodiment will be described. A zero point affects not only the stability of the circuit as described above, but also a response of the circuit (in particular, a rising point). In a case where the zero point is located at a high frequency, the stability of the circuit is deteriorated, but the circuit responds at a high speed. On the other hand, in a case where the zero point is located at a low frequency, the stability of the circuit becomes high, but the response of the circuit becomes slow.

Thus, it is important to design the position of the zero point in consideration of the trade-off between the stability of the circuit and the response speed.

Further, the required degree of stability of the circuit differs before and after a phase lock. Before the phase lock, an oscillation frequency of the PLL circuit 3 has not been determined yet, and a bias point of the circuit has also not converged. In such a situation, the demand for the stability of the circuit is not very high. Namely, in a process of the phase lock, the speed to the phase lock may be prioritized over the stability of the circuit. Therefore, it is desirable that the zero point is located at the high frequency before the phase lock.

On the other hand, the stability of the circuit is more important than the high speed response after the phase lock. Therefore, it is desirable that the zero point is located at the low frequency after the phase lock. As described above, if the zero point is changed dynamically before and after the phase lock, it is possible to achieve both the stability of the circuit and the high speed response.

In the present embodiment, the pulse generator 70 is provided between a phase comparator 10 and the intermittent operation gm amplifier 61 in a double integrator path 60. The pulse generator 70 is configured to monitor a voltage signal outputted from the phase comparator 10 (that is, a first voltage signal), and determine whether a phase is locked or not. Then, in a case where it is determined that the phase has not been locked yet, the pulse generator 70 inputs a pulse CLK for an intermittent operation with a large pulse width into the intermittent operation gm amplifier 61 so that the zero point is located at the high frequency. On the other hand, in a case where it is determined that the phase is locked, the pulse generator 70 inputs a pulse CLK for an intermittent operation with a small pulse width into the intermittent operation gm amplifier 61 so that the zero point is located at the low frequency. Note that the pulse width of the pulse CLK for the intermittent operation is determined on the basis of a difference between a reference clock, which is an input into the phase comparator 10, and a feedback clock, which is an output from the divider 50.

Figure 7:
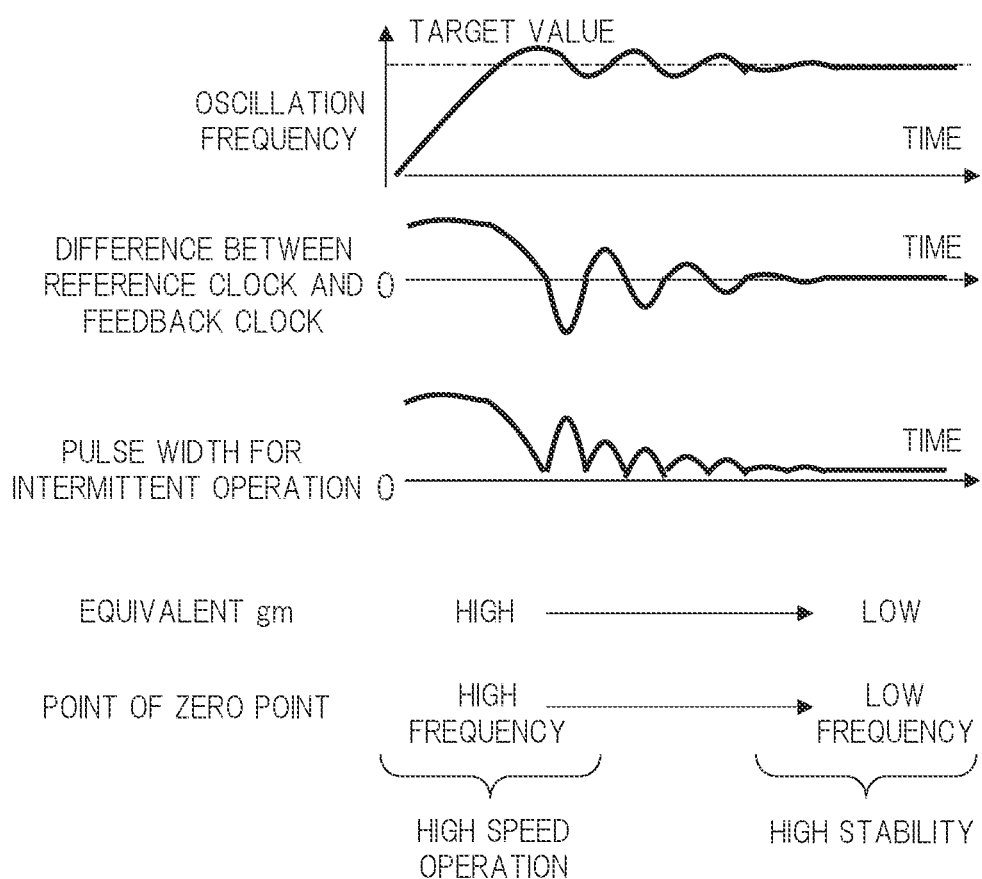
FIG. 7 is a view illustrating respective characteristic waveforms when a zero point changes dynamically.

Next, an operation of the present embodiment will be described briefly on the basis of graphs of respective characteristic waveforms. FIG. 7 is a view illustrating respective characteristic waveforms when a zero point changes dynamically. FIG. 7 illustrates, as characteristic waveforms, an oscillation frequency, a difference between a reference clock and a feedback clock, a pulse width of a pulse CLK for an intermittent operation, an equivalent mutual conductance gm, and a time lapse of a point of the zero point.

When the PLL circuit 3 is activated, the oscillation frequency rises toward a target value. In a case where the oscillation frequency does not reach the target value, a phase difference between a reference clock and a feedback clock becomes large.

This phase difference is detected by the phase comparator 10, and the pulse generator 70 generates a pulse CLK for an intermittent operation having the same pulse width as the phase difference. When the oscillation frequency approaches the target value, the phase difference between the reference clock and the feedback clock gradually becomes smaller. Therefore, the pulse width of the pulse CLK for the intermittent operation outputted from the pulse generator 70 is wide before the phase lock; becomes narrower through the steps; and becomes a narrow constant value after the phase lock.

The pulse generator 70 uses such a signal to generate the pulse CLK for the intermittent operation, and outputs the generated pulse CLK for the intermittent operation to the intermittent operation gm amplifier 61. As a result, the intermittent operation gm amplifier 61 causes the double integrator path 60 to operate at a high speed before the phase lock, whereby a time until the phase lock is shortened. On the other hand, the intermittent operation gm amplifier 61 causes the double integrator path 60 to operate at a low speed after the phase lock, whereby the stability of the circuit is heightened.

(Features and Effects of Third Embodiment)

Next, main features and main effects of the PLL circuit 3 using the intermittent operation amplifier according to the third embodiment will be described.

The main features of the PLL circuit 3 using the intermittent operation amplifier according to the present embodiment are that the pulse generator 70 is further provided in order to change the pulse width of the pulse CLK for the intermittent operation for the intermittent operation gm amplifier 61 before and after the clock phase is locked. Further, a further feature is that by using this pulse generator 70, the double integrator path 60 is caused to operate at the high speed before the phase lock, and the double integrator path 60 is caused to operate at the low speed after the phase lock.

Since the PLL circuit 3 has the configuration as described above, it is possible to dynamically control the zero point at the double integrator path 60 side before and after the phase lock of the PLL circuit 3. This makes it possible to realize a high speed operation of the double integrator path 60 before the phase lock, and to obtain high stability of the circuit after the phase lock.

Fourth Embodiment

Next, a fourth embodiment will be described. Note that hereinafter, the same reference numerals are respectively assigned to components having the similar functions to those in any of the first embodiment to the third embodiment, and explanation thereof will be omitted in principle. In the first embodiment, the output currents from all of the integrator path 20, the proportional path, and the double integrator path 60 are inputted into one current controlled oscillator 40, and the intermittent operation gm amplifier 61 executes the same operation before and after the phase lock. In the present embodiment, a PLL circuit using an intermittent operation amplifier, which includes two current controlled oscillators respectively having different oscillation frequency ranges, will be described.

(Configuration of PLL Circuit Using Intermittent Operation Amplifier)

Figure 8:
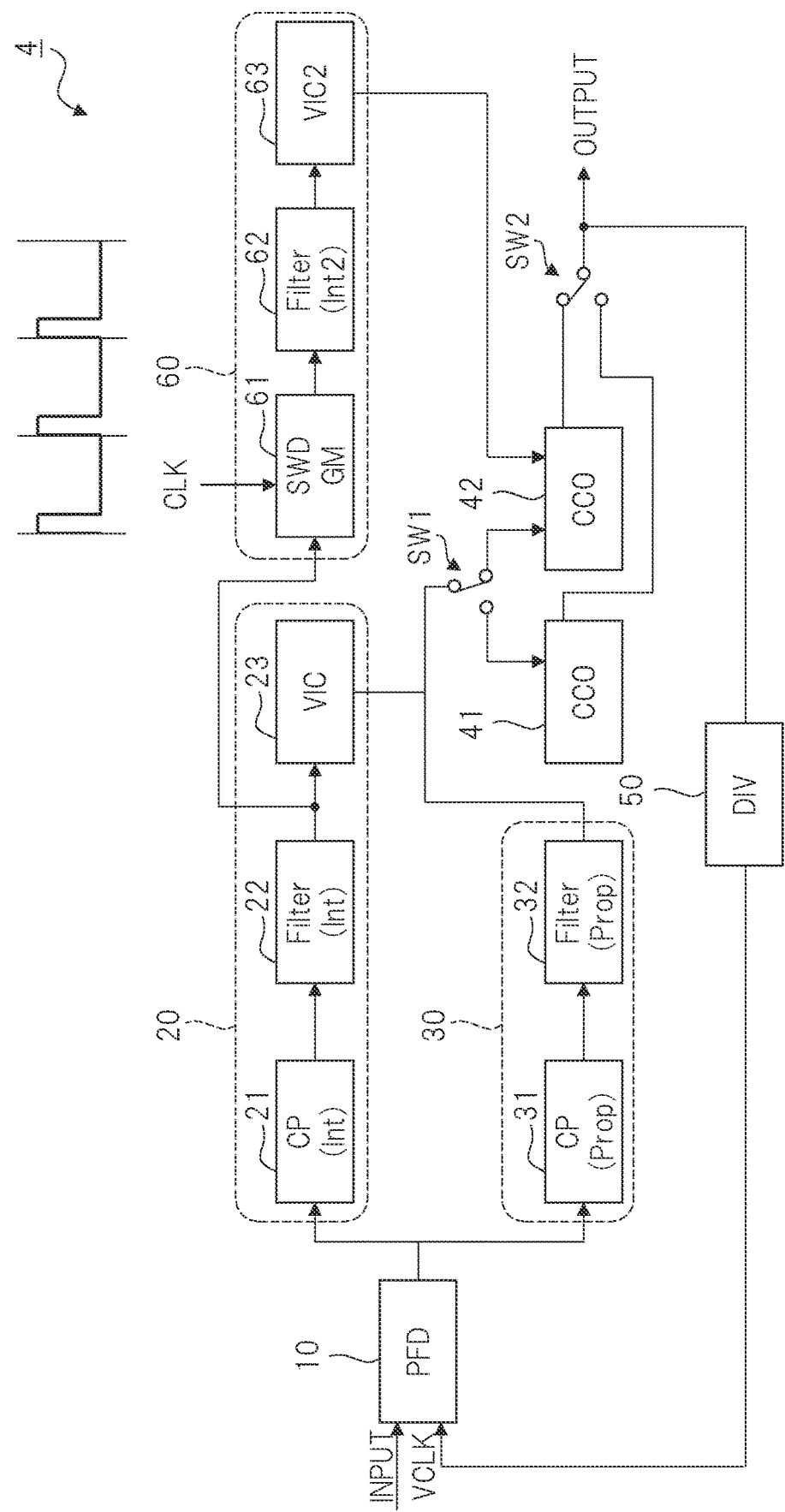
FIG. 8 is a block diagram illustrating one example of a PLL circuit using an intermittent operation amplifier according to a fourth embodiment.

First, one example of a configuration of a PLL circuit 4 using an intermittent operation amplifier according to the fourth embodiment (hereinafter, may be abbreviated as a "PLL circuit 4") will be described. FIG. 8 is a block diagram illustrating one example of a PLL circuit using an intermittent operation amplifier according to the fourth embodiment. As illustrated in FIG. 8, the PLL circuit 4 according to the present embodiment includes two current controlled oscillators 41, 42 obtained by adding further one, and two switches SW1, SW2 in addition to the configuration of the PLL circuit 1 according to the first embodiment. Note that a configuration and an operation of the PLL circuit 4 other than those regarding the current controlled oscillators are similar to the configuration and the operation of the PLL circuit 1 according to the first embodiment, and detailed explanation thereof will thus be omitted herein.

The current controlled oscillator 41 is an oscillator for oscillation at an intermediate frequency, and the current controlled oscillator 42 is an oscillator for oscillation at a high frequency. The switches SW1, SW2 are respectively provided in a front stage and a rear stage of the current controlled oscillators 41, 42, and are switches configured to select any of the current controlled oscillators 41, 42.

In the PLL circuit 4 according to the present embodiment, in a case where an external system requires oscillation at an intermediate frequency, the current controlled oscillator 41 is selected by the switches SW1, SW2. As a result, as well as the conventional circuit, an oscillation signal with an intermediate frequency is outputted by a PLL circuit composed of a phase comparator 10, an integrator path 20, a proportional path 30, a current controlled oscillator 41, and a divider 50.

On the other hand, in the PLL circuit 4, in a case where the external system requires oscillation at a high frequency, the current controlled oscillator 42 is selected by the switches SW1, SW2. As a result, as well as the first embodiment described above, an oscillation signal with a high frequency is outputted by the PLL circuit composed of the phase comparator 10, the integrator path 20, the proportional path 30, the current controlled oscillator 42, the divider 50, and the double integrator path 60.

(Features and Effects of Fourth Embodiment)

Next, main features and main effects of the PLL circuit 4 using the intermittent operation amplifier according to the fourth embodiment will be described.

The main features of the PLL circuit 4 using the intermittent operation amplifier according to the present embodiment are that the frequency of the oscillation signal of the PLL circuit 4 is switched by switching between the two current controlled oscillators 41, 42 by means of the switches SW1, SW2.

Since the PLL circuit 4 has the configuration as described above, it is possible to address requirement of for a wide range of oscillation frequencies by one PLL circuit 4.

(Abstract of Present Invention)

Figure 9:
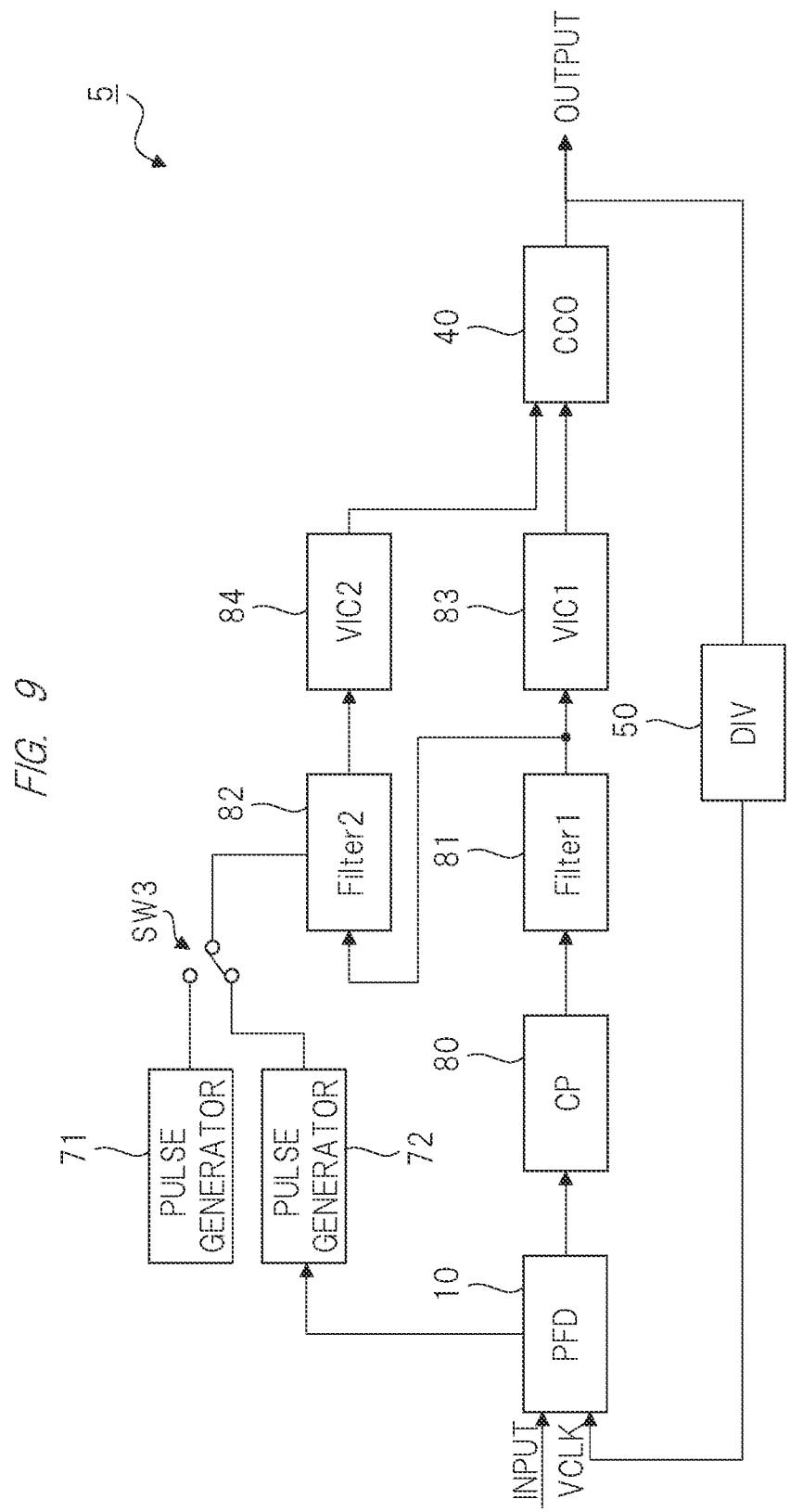
FIG. 9 is a block diagram in which the PLL circuit according to the present invention is abstracted.

Finally, a configuration in which the present invention is abstracted will be described. An abstracted configuration of a PLL circuit 5 using an intermittent operation amplifier (hereinafter, may be abbreviated as the "PLL circuit 5") will be described. FIG. 9 is a block diagram in which the PLL circuit according to the present invention is abstracted. As illustrated in FIG. 9, the PLL circuit 5 includes a phase comparator 10, a charge pump 80, two filter circuits 81, 82, two voltage-current conversion circuits 83, 84, a current controlled oscillator 40, a divider 50, and two pulse generators 71, 72. Thus, the concept of the present invention can also include PLL topology having a single path.

The PLL circuit 5 switches between the two pulse generators 71, 72 by means of a switch SW3 to adjust an input potential from the filter circuit 82 to the voltage-current conversion circuit 84. In a case where the pulse generator 71 is selected by the switch SW3, the PLL circuit 5 has a similar configuration to that of the PLL circuit 1 according to the first embodiment, and executes a similar operation of the PLL circuit 1. Further, in a case where the pulse generator 72 is selected by the switch SW3, the PLL circuit 5 has a similar configuration to that of the PLL circuit 3 according to the third embodiment, and executes a similar operation of the PLL circuit 3.

As described above, the invention made by the inventors of the present application has been described specifically on the basis of the embodiments. However, the present invention is not limited to the first to fourth embodiments described above, and it goes without saying that the present invention may be modified into various forms without departing from the substance thereof.

For example, the case where the pulse generator 70 outputs the pulse CLK for the intermittent operation having the large or small pulse width on the basis of the voltage signal outputted from the phase comparator 10 has been described in the third embodiment. However, the present invention is not limited to such a configuration. The reference clock and the feedback clock to be inputted into the phase comparator 10 may be inputted into the pulse generator 70 as they are, and the pulse generator 70 may calculate a phase difference of these to output the pulse CLK for the intermittent operation having the large or small pulse width.

What is claimed is:

1. A PLL circuit using an intermittent operation amplifier, the PLL circuit comprising:
    a phase comparator configured to detect a phase difference between a reference clock and a feedback clock to output a first voltage signal based on the phase difference;
    an integrator path including a first filter circuit and a first voltage-current conversion circuit, the first voltage signal from the phase comparator being input to the integrator path, the integrator path being configured to output a first current signal;
    a proportional path including a second filter circuit, the first voltage signal from the phase comparator being input to the proportional path, the proportional path being configured to output a second current signal;
    a double integrator path including a gm amplifier, a third filter circuit, and a second voltage-current conversion circuit, a second voltage signal from the first filter circuit of the integrator path being input to the double integrator path, the double integrator path being configured to output a third current signal;
    a current controlled oscillator into which the first current signal, the second current signal, and the third current signal are respectively input from the integrator path, the proportional path, and the double integrator path, the current controlled oscillator being configured to output an oscillation signal with a frequency clock based on a total current amount; and
    a divider configured to divide the oscillation signal to output a signal obtained by dividing the oscillation signal as the feedback clock to the phase comparator,
    wherein a pulse signal for causing the gm amplifier to execute an intermittent operation is input into the gm amplifier, and
    wherein each of the integrator path and the double integrator path forms a zero point of an open-loop characteristic of the PLL circuit after a phase of the oscillation signal is locked.

2. A PLL circuit using an intermittent operation amplifier, the PLL circuit comprising:
    a phase comparator configured to detect a phase difference between a reference clock and a feedback clock to output a first voltage signal based on the phase difference;
    an integrator path including a first filter circuit and a first voltage-current conversion circuit, the first voltage signal from the phase comparator being input to the integrator path, the integrator path being configured to output a first current signal;
    a proportional path including a second filter circuit, the first voltage signal from the phase comparator being input to the proportional path, the proportional path being configured to output a second current signal;
    a double integrator path including a gm amplifier, a third filter circuit, and a second voltage-current conversion circuit, a second voltage signal from the first filter circuit of the integrator path being input to the double integrator path, the double integrator path being configured to output a third current signal;
    a current controlled oscillator into which the first current signal, the second current signal, and the third current signal are respectively input from the integrator path, the proportional path, and the double integrator path, the current controlled oscillator being configured to output an oscillation signal with a frequency clock based on a total current amount; and
    a divider configured to divide the oscillation signal to output a signal obtained by dividing the oscillation signal as the feedback clock to the phase comparator,
    wherein a pulse signal for causing the gm amplifier to execute an intermittent operation is input into the gm amplifier,
    wherein the second voltage-current conversion circuit is configured to output the third current signal regardless of whether the pulse signal input into the gm amplifier is on or off when an input potential of the second voltage-current conversion circuit rises, and
    wherein the current controlled oscillator is configured to output an oscillation signal having a higher frequency clock by an amount of the third current signal with respect to the oscillation signal based on the first signal and the second signal.

3. A PLL circuit using an intermittent operation amplifier, the PLL circuit comprising:
    a phase comparator configured to detect a phase difference between a reference clock and a feedback clock to output a first voltage signal based on the phase difference;
    an integrator path including a first filter circuit and a first voltage-current conversion circuit, the first voltage signal from the phase comparator being input to the integrator path, the integrator path being configured to output a first current signal;
    a proportional path including a second filter circuit, the first voltage signal from the phase comparator being input to the proportional path, the proportional path being configured to output a second current signal;
    a double integrator path including a gm amplifier, a third filter circuit, and a second voltage-current conversion circuit, a second voltage signal from the first filter circuit of the integrator path being input to the double integrator path, the double integrator path being configured to output a third current signal;
    a current controlled oscillator into which the first current signal, the second current signal, and the third current signal are respectively input from the integrator path, the proportional path, and the double integrator path, the current controlled oscillator being configured to output an oscillation signal with a frequency clock based on a total current amount; and
    a divider configured to divide the oscillation signal to output a signal obtained by dividing the oscillation signal as the feedback clock to the phase comparator,
    wherein a pulse signal for causing the gm amplifier to execute an intermittent operation is input into the gm amplifier,
    wherein the PLL circuit further comprises a pulse generator configured to generate the pulse signal, wherein the first voltage signal is input from the phase comparator to the pulse generator, and wherein the pulse generator is configured to change a pulse width of the pulse signal on a basis of a phase difference indicated by the first voltage signal, and output the pulse signal whose pulse width is changed to the gm amplifier.

4. The PLL circuit according to claim 3, wherein the pulse generator is configured to:

determine whether a phase of the oscillation signal is locked or not;

output, to the gm amplifier, a pulse signal having the pulse width based on the phase difference indicated by the first voltage signal until it is determined that the phase of the oscillation signal is locked; and output, to the gm amplifier, a pulse signal having a smaller pulse width than a pulse width when the phase of the oscillation signal is not locked in a case where it is determined that the phase of the oscillation signal is locked.

* * * * *